(12) United States Patent
Donis et al.

(10) Patent No.: US 8,039,975 B2
(45) Date of Patent: Oct. 18, 2011

(54) DEVICE COMPRISING A SEMICONDUCTOR COMPONENT, AND A MANUFACTURING METHOD

(75) Inventors: Dieter Donis, Stuttgart (DE); Jens Koenig, Markgroeningen (DE)

(73) Assignee: Robert Bosch GmbH, Stuttgart (DE)

( * ) Notice: Subject to any disclaimer, the term of this patent is extended or adjusted under 35 U.S.C. 154(b) by 183 days.

(21) Appl. No.: 12/404,766

(22) Filed: Mar. 16, 2009

(65) Prior Publication Data
US 2009/0230569 A1 Sep. 17, 2009

(30) Foreign Application Priority Data
Mar. 17, 2008 (DE) .......................... 10 2008 014 653

(51) Int. Cl.
*H01L 23/31* (2006.01)
(52) U.S. Cl. ................ 257/787; 257/712; 257/E23.123; 438/127
(58) Field of Classification Search ................ 257/712, 257/787, E23.123, E21.502, 678, 711, 713, 257/778, E21.501; 438/106, 121, 127
See application file for complete search history.

(56) References Cited

U.S. PATENT DOCUMENTS

| 6,731,012 B1 * | 5/2004 | Brodsky et al. ............... 257/778 |
| 7,002,247 B2 * | 2/2006 | Mok et al. .................... 257/713 |
| 7,288,839 B2 * | 10/2007 | Colgan et al. ................. 257/707 |
| 2006/0005952 A1 | 1/2006 | Yeh et al. |

FOREIGN PATENT DOCUMENTS

| DE | 199 51 945 | 5/2001 |
| DE | 102 49 205 | 8/2004 |

* cited by examiner

*Primary Examiner* — Roy Potter
(74) *Attorney, Agent, or Firm* — Kenyon & Kenyon LLP

(57) ABSTRACT

A device having at least one semiconductor component, which is covered by a protective material on its outer surface. The invention provides for the outer surface to be provided with a surface structure so as to enlarge the heat transfer area to the protective material. The invention furthermore relates to a manufacturing method.

16 Claims, 1 Drawing Sheet

DEVICE COMPRISING A SEMICONDUCTOR COMPONENT, AND A MANUFACTURING METHOD

FIELD OF THE INVENTION

The present invention relates to a device having at least one semiconductor component and a method for manufacturing a device having at least one semiconductor component.

BACKGROUND INFORMATION

Power semiconductor components situated on a substrate are known, which are frequently covered by a molding material. The task of the molding material is to protect the power semiconductor component against environmental influences such as against moisture, aggressive media as well as against corrosion. In addition, the molding material often takes on the function of an electric insulator. Since the molding material has an approximately 10-fold lower thermal conductivity in comparison to the substrate, known electrical power semiconductor components are cooled essentially via the respective substrate.

DE 199 51 945 A1 discusses a semiconductor component fixed on a base plate, which is provided with a metallic coating on the lateral wall so as to be able to dissipate laterally waste heat produced in operation. The known device is not covered by a protective material.

US 2006/0005952 A1 discusses a heat dissipation device having a microstructure layer and an inner chamber. The chamber is used for accommodating a work fluid.

DE 102 49 205 B3 discusses a device having multiple semiconductor components which have separate heat sinks assigned to them.

SUMMARY OF THE INVENTION

Technical Object

The exemplary embodiments and/or exemplary methods of the present invention are based on the objective to improve the dissipation of heat from semiconductor components that are covered on their outer surface by a protective layer. Furthermore, the objective is to indicate a corresponding manufacturing process.

Technical Approach

This objective is achieved with respect to the device by the features described herein and with respect to the manufacturing method by the features described herein.

Advantageous further refinements of the exemplary embodiments and/or exemplary methods of the present invention are provided in the description herein. The framework of the exemplary embodiments and/or exemplary methods of the present invention includes all combinations of at least two of the features disclosed in the specification, the claims and/or the figures. In order to avoid repetitions, features disclosed in terms of the device shall also count as disclosed and be claimable in terms of the method. Likewise, features disclosed in terms of the method shall count as disclosed and be claimable in terms of the device.

The exemplary embodiments and/or exemplary methods of the present invention are based on the idea of using the protective material, in particular a molding material, with which the semiconductor component is covered on its outer surface, to a greater degree for dissipating heat. In order to ensure a sufficient heat flow from the semiconductor component into the protective material, which normally has a low thermal conductivity, the exemplary embodiments and/or exemplary methods of the present invention provides for enlarging the contact area between the semiconductor component and the protective material. To enlarge the contact area, the exemplary embodiments and/or exemplary methods of the present invention provides for the outer surface of the semiconductor component to be provided with a surface structure by which the outer surface area of the semiconductor component may be enlarged, in particular many times, and thus the contact area between the semiconductor component and the protective material may be enlarged. For this purpose, the effect is utilized that the protective material adapts in its shape to the surface structure. By providing a surface structure directly on the semiconductor component, it is possible to increase the cooling of the semiconductor component by a factor of 1.4 to 5 due to the increased interface cross section. The factor essentially depends on the aspect ratio of the surface structure.

Depending on the development or formation of the surface structure, an even more far-reaching improvement of the cooling process may be realized. Providing a surface structure has further advantages in addition to the improved cooling. Thus, for example, the adhesion of the protective material, in particular the molding material, on the electrical semiconductor component is improved, whereby a delamination may be largely prevented. This in turn results in an increased reliability of the device as a whole. Moreover, the size of the semiconductor component may be reduced further, as a result of which less space is required overall. In the event that the semiconductor component is situated on a substrate, the exemplary embodiments and/or exemplary methods of the present invention allows for a considerably wider range of materials for the substrate because lower requirements may be placed on its thermal conductivity. This makes it possible to reduce the manufacturing costs overall. In addition, the strength of the bonding of the protective material to the semiconductor component is increased on account of the form fit achieved and the increased contact area. Experiments have shown that the protective material is more stable in the region of the surface structure than at a distance from it and that, when stressed, the protective material is more likely to rupture at a distance from the semiconductor component than above the surface structure.

Particularly advantageous is a specific embodiment in which the at least one semiconductor component of the device is a power semiconductor component. In power semiconductor components, a substantial heat generation is to be expected, it being possible for the surface structure of the outer surface of the power semiconductor component to give off the generated heat, at least to a large extent, to the protective material and to be dissipated by the latter. A specific embodiment, in which the power semiconductor component is a power IC, or a power transistor, and in particular may be a MOSFET or an IGBT. It may particularly be the case that the power semiconductor component is manufactured on a silicon carbide basis (SiC) or a gallium arsenide basis (GaAs).

Regarding the concrete development of the surface structure there are several possibilities. Thus it is possible, for example, to develop the surface structure as a millimeter structure, that is, to provide structural elements in the order of magnitude of one or several millimeters. Additionally or alternatively, the surface structure may include smaller structural elements in the micrometer range and/or in the nanometer range. The selection of the surface structure depends in particular on the concrete application, on the selection of the protective material and on the quantity of heat to be dissipated.

A specific embodiment may also be implemented in which surface structures of different dimensions, i.e., different structural elements, are arranged in an superposed manner. Expressed differently, it is possible to provide, for example, multiple micro (meter) structural elements and/or multiple nanometer structural elements on a millimeter structural element. It is likewise possible to arrange multiple nanometer structural elements on a micrometer structural element in order thus to enlarge further the contact area between the semiconductor component and the molding material.

A specific embodiment may be provided in which the surface structure is produced or introduced into the outer surface of the semiconductor component by laser processing. With the aid of a laser it is possible to produce almost any kind of surface structure—even in different dimensions—on the semiconductor component.

A further development of the exemplary embodiments and/or exemplary methods of the present invention advantageously provides for the surface structure to be developed in a regular manner, at least in regions, which may be in its entirety. Expressed differently, a specific embodiment may have an at least sectionally regular surface structure of the semiconductor component as a repeating pattern.

Alternatively, the surface structure may have statistically distributed structural elements. It is also possible to develop the surface structure deliberately in an irregular manner, at least in regions, in order to cool the location of the greatest heat generation in a targeted manner.

Regarding the concrete formation of the surface structure there are different possibilities. Thus it is conceivable to form the surface structure, at least in regions, which may be over the entire semiconductor component, to have a jagged cross section. A kind of pointed tooth structure is thus obtained in the cross section.

Additionally or alternatively, a surface structure having parallel grooves that have a rectangular cross section may be provided.

As mentioned at the outset, it is possible—but not essential—for the semiconductor component to be situated on a substrate, in particular on silicon, it being possible for the semiconductor component to be fixed on the substrate by all known techniques. The semiconductor component may be covered entirely by the protective material on the outer surface facing away from the substrate, a specific embodiment being realizable as well, in which the semiconductor component is covered only in regions by a protective material. In all places where the semiconductor component is provided with the protective material, a surface structure may be produced in the outer surface of the semiconductor component for enlarging the contact area between the semiconductor component and the protective material.

A specific embodiment is particularly advantageous in which the protective material is not exclusively situated on the semiconductor component, but projects laterally beyond it and extend all the way onto the substrate. The substrate may also be covered, which may be in its entirety, by the protective material in order thus to implement a sufficient protective function against moisture and aggressive media. It may particularly be the case that the protective material is chosen in such a way that it acts as an electrical insulator.

The exemplary embodiments and/or exemplary methods of the present invention also leads to a method for manufacturing a device having at least one semiconductor component. A method developed according to the exemplary embodiments and/or exemplary methods of the present invention provides for the contact area between the semiconductor component and a protective material covering the semiconductor component at least partially to be enlarged in that a surface structure is introduced into the outer surface of the semiconductor component. This may be developed as previously described with reference to the device.

Particularly advantageous is a specific embodiment of the manufacturing method in which the surface structure is introduced into the outer surface by laser processing prior to applying the protective material.

Additional advantages, features and details of the present invention derive from the following description of exemplary embodiments as well as from the drawings.

DETAILED DESCRIPTION

In the figures, identical components and components having the same function are designated by the same reference symbols.

Figure 1:
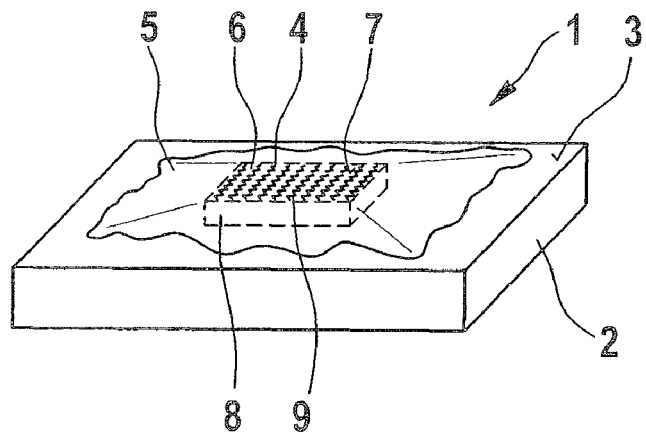
FIG. 1 shows a schematic representation of a device, including a semiconductor component covered by a protective material, the outer surface of which is provided with a surface structure.

FIG. 1 shows a device, in this instance a semiconductor component system. Device 1 includes a substrate 2 made from silicon, on the top side 3 of which a semiconductor component 4 in the form of a power semiconductor component is fixed in a manner known per se. Semiconductor component 4 is covered by a protective material 5, protective material 5 covering the outer surface 6 of semiconductor component 4. In particular, protective material 5 covers a surface 7 running in parallel to substrate 2 as well as lateral surfaces 8 of semiconductor component 4. In addition to the one shown semiconductor component 4, device 1 may include a plurality of semiconductor components 4, of which at least one semiconductor component 4, which may be all semiconductor components 4, in particular all power semiconductor components, are each provided with a surface structure 9 in order to implement an optimized heat transfer to protective material 5.

In the exemplary embodiment shown, protective material 5 has the task of protecting semiconductor component 4 against moisture, aggressive media and thus against corrosion. In addition, in the shown exemplary embodiment, protective material 5 has the function of an electrical insulator. The protective material may be developed in numerous ways, for example as a thermosetting plastic and/or a thermoplastic (molding compound). It is also possible for protective material 5 to include reaction resin (e.g. 10-30%), mineral fillers (e.g. 50-70%), and possibly waxes and/or additives.

In order to enlarge the contact area between semiconductor component 4 and protective material 5, a surface structure 9 is introduced by laser processing into outer surface 6, more precisely into surface 7, the structural elements of surface structure 9 having dimensions in the micrometer range (here between 1 μm and 100 μm) in the exemplary embodiment shown. In addition or as an alternative to surface 7, surface structure 9 may also be provided in lateral surfaces 8 running perpendicular to substrate 2, which in the shown exemplary embodiment, however, are developed to be free of surface structure.

By providing surface structure 9, which is introduced into outer surface 6 of semiconductor component 4 prior to the application of protective material 5, the interface cross section of protective material 5 to semiconductor component 4 is enlarged such that the dissipation of heat into protective material 5 and from the latter into the environment is optimized. Expressed differently, semiconductor component 4 is cooled to a considerable portion via protective material 5 and not as in the related art essentially only via substrate 2.

Figure 2:
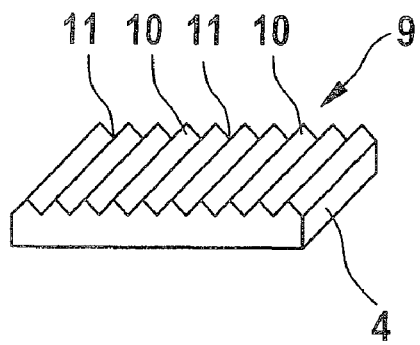
FIG. 2 shows a possible embodiment of the surface structure having jags situated side by side in its cross section.

Regarding the concrete development of surface structure 9 there are different possibilities. FIG. 2 shows a possible specific embodiment of surface structure 9. Surface structure 9 as shown in FIG. 2 was introduced into semiconductor component 4 by laser processing prior to applying protective material 5. It can be seen that surface structure 9 is a regular structure (pattern) that is developed to be jagged in cross section. Expressed differently, the surface structure comprises parallel elevations 10 tapering to a sharp point, a depression 11 tapering to a sharp point being provided respectively between two adjacent elevations 10.

Figure 3:
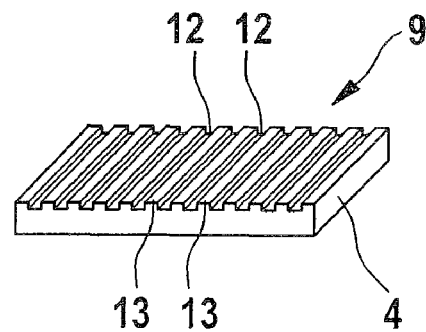
FIG. 3 shows an alternative specific embodiment of the surface structure having multiple rectangular grooves running in parallel with one another.

FIG. 3 shows a semiconductor component 4 having an alternative surface structure 9. Surface structure 9 as shown in FIG. 3 has multiple, essentially rectangularly contoured parallel grooves 12, two adjacent grooves 12 running in parallel to each other being separated from each other by a rectangular elevation 13.

Differently executed surface structures may be additionally or alternatively implemented on a semiconductor component 4.

What is claimed is:

1. A device comprising:
   a protective material; and
   at least one semiconductor component, which is covered by the protective material on its outer surface;
   wherein the outer surface is provided with at least one surface structure so as to enlarge a heat transfer area to the protective material;
   wherein the semiconductor component includes a power semiconductor component.

2. The device of claim 1, wherein the surface structure includes at least one of a millimeter structure, a micrometer structure, and a nanometer structure.

3. The device of claim 2, wherein variously dimensioned ones of the surface structures are arranged in a superposed manner.

4. The device of claim 1, wherein the surface structure is produced by laser processing.

5. The device of claim 1, wherein the surface structure is developed to be one of regular, at least in regions, and to have statistically distributed structural elements.

6. The device of claim 1, wherein the surface structure is formed to be jagged in its cross section.

7. The device of claim 1, wherein the surface structure has parallel grooves that are rectangular in cross section.

8. The device of claim 1, wherein the semiconductor component is fixed on a substrate.

9. The device of claim 8, wherein the protective material laterally projects beyond the semiconductor component and extends all the way onto the substrate.

10. A method for manufacturing a device having at least one semiconductor component, the method comprising:
    covering an outer surface of the semiconductor component with a protective material; and
    providing the outer surface of the semiconductor component with a surface structure for enlarging a heat transfer area to the protective material;
    wherein the semiconductor component includes a power semiconductor component.

11. The method of claim 10, wherein the surface structure is introduced by laser processing into the outer surface of the semiconductor component.

12. The method of claim 10, wherein the outer surface of the semiconductor component is provided with the surface structure for enlarging the heat transfer area to the protective material prior to covering it with the protective material.

13. The device of claim 1, wherein the power semiconductor component includes at least one of a power IC and a power transistor.

14. The device of claim 1, wherein the power semiconductor component includes at least one of a power IC and a power transistor that is one of a MOSFET and an IGBT.

15. The device of claim 1, wherein the surface structure is developed to be one of regular, in its entirety, and to have statistically distributed structural elements.

16. The device of claim 1, wherein the semiconductor component is fixed on a substrate that is made of silicon.

* * * * *